US008884275B2

(12) United States Patent
Lee et al.

(10) Patent No.: US 8,884,275 B2
(45) Date of Patent: Nov. 11, 2014

(54) ORGANIC LIGHT-EMITTING DISPLAY APPARATUS AND METHOD OF MANUFACTURING THE SAME

(71) Applicants: Yul-Kyu Lee, Yongin (KR); Sun Park, Yongin (KR); Kyu-Sik Cho, Yongin (KR)

(72) Inventors: Yul-Kyu Lee, Yongin (KR); Sun Park, Yongin (KR); Kyu-Sik Cho, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 206 days.

(21) Appl. No.: 13/653,641

(22) Filed: Oct. 17, 2012

(65) Prior Publication Data

US 2013/0306938 A1 Nov. 21, 2013

(30) Foreign Application Priority Data

May 16, 2012 (KR) ........................ 10-2012-0052215

(51) Int. Cl.
*H01L 35/24* (2006.01)

(52) U.S. Cl.
USPC .................................... 257/40; 257/E51.001

(58) Field of Classification Search
USPC ............................................ 257/40, E51.001
See application file for complete search history.

(56) References Cited

U.S. PATENT DOCUMENTS 6,531,815 B1 3/2003 Okuyama et al.
8,030,838 B2 10/2011 Kwak et al.

FOREIGN PATENT DOCUMENTS

KR 10-2001-0050782 A 6/2001
KR 10-2007-0048446 A 5/2007
KR 10-0875103 B1 12/2008

*Primary Examiner* — Anthony Ho
(74) *Attorney, Agent, or Firm* — Lee & Morse, P.C.

(57) ABSTRACT

An organic light-emitting apparatus includes a thin film transistor (TFT) including an active layer, a gate electrode, and source and drain electrodes, an organic light-emitting device including a pixel electrode connected to the TFT, an intermediate layer including an emissive layer, and an opposite electrode, an opposite electrode contact portion connecting the opposite electrode to a power interconnection line. The power interconnection line connected to the opposite electrode contact portion includes a first interconnection layer and a second interconnection layer which are stacked without an insulating layer therebetween.

12 Claims, 6 Drawing Sheets

ORGANIC LIGHT-EMITTING DISPLAY APPARATUS AND METHOD OF MANUFACTURING THE SAME

CROSS-REFERENCE TO RELATED PATENT APPLICATION

This application claims the benefit under 35 U.S.C. §119 of Korean Patent Application No. 10-2012-0052215, filed on May 16, 2012, in the Korean Intellectual Property Office, the disclosure of which is incorporated herein in its entirety by reference.

BACKGROUND

1. Field

Embodiments relate to an organic light-emitting display apparatus.

2. Description of the Related Art

Typically, an organic light-emitting display apparatus includes a thin film transistor (TFT) and an organic light-emitting device, and when an appropriate driving signal is transmitted to the organic light-emitting device, the organic light-emitting device emits light, thereby embodying a desired image.

In this regard, the TFT includes an active layer, a gate electrode, and source and drain electrodes, which are all stacked on a substrate. Accordingly, when a current is supplied to the gate electrode via an interconnection line formed in the substrate, a current flows in the source and drain electrodes via the active layer, and at the same time, a current flows in a pixel electrode of an organic light-emitting device connected to the source and drain electrodes.

The organic light-emitting device includes the pixel electrode, an opposite electrode facing the pixel electrode, and an emissive layer interposed between the pixel electrode and the opposite electrode. In regard to this structure, when a current flows in a pixel electrode via the TFT, there is an appropriate level of voltage between the opposite electrode and the pixel electrode, and thus, the emissive layer emits light, thereby embodying an image.

SUMMARY

Embodiments are directed to an organic light-emitting display apparatus including a thin film transistor (TFT) including an active layer, a gate electrode, and source and drain electrodes, and an organic light-emitting device including a pixel electrode connected to the TFT, an intermediate layer having an emissive layer, and an opposite electrode, an opposite electrode contact portion connecting the opposite electrode to a power interconnection line, and the power interconnection line connected to the opposite electrode contact portion including a first interconnection layer and a second interconnection layer, the first and second interconnection layers being stacked without an insulating layer therebetween.

The first interconnection layer may be on a same plane as the gate electrode. The second interconnection layer may be formed of a same material layer as the source and drain electrodes.

The organic light-emitting display apparatus may further include a first insulating layer that is outside the power interconnection line of the opposite electrode contact portion, with an interval being between the first insulating layer and the power interconnection line, and a second insulating layer filling the interval between the first insulating layer and the power interconnection line.

The organic light-emitting display apparatus may further include a gate insulating layer between the active layer and the gate electrode, and a buffer layer under the active layer, the gate insulating layer and the buffer layer including open portions adjacent to the opposite electrode contact portion, wherein the second insulating layer further fills the open portions of the gate insulating layer and the buffer layer.

The second insulating layer may be present between an end of the second interconnection layer and the opposite electrode.

The second interconnection layer may surround an end of the first interconnection layer. The second insulating layer may be present between the end of the second interconnection layer and the first insulating layer.

The first interconnection layer and the second interconnection layer may be formed in a same pattern. The second insulating layer may be present between the first insulating layer and ends of the first interconnection layer and the second interconnection layer.

Embodiments are also directed to a method of manufacturing an organic light-emitting display apparatus, including forming a first interconnection layer in an opposite electrode contact portion of a substrate, forming a first insulating layer outside the first interconnection layer, with an interval therebetween, forming a second interconnection layer on the first interconnection layer to form a power interconnection line including a plurality of interconnection layers, forming a second insulating layer on an end of the second interconnection layer and between the power interconnection line and the first insulating layer, and forming an opposite electrode on the second insulating layer such that the opposite electrode contacts the power interconnection line.

The method may further include forming an active layer, a gate electrode, and source and drain electrodes of a thin film transistor (TFT), wherein the first interconnection layer and the gate electrode are formed of a same material on a same plane, and the second interconnection layer and the source and drain electrodes are formed of a same material layer.

The method may further include sequentially depositing a buffer layer and a gate insulating layer on the substrate such that the gate insulating layer and the buffer layer include open portions adjacent to the opposite electrode contact portion, and forming the second insulating layer filling the open portions of the gate insulating layer and the buffer layer.

The second interconnection layer may surround an end of the first interconnection layer. The second insulating layer may be interposed between the end of the second interconnection layer and the first insulating layer.

The second interconnection layer may be formed on the first interconnection layer in a same pattern as the first interconnection layer. The second insulating layer may be interposed between ends of the first insulating layer and the first interconnection layer and the second interconnection layer.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
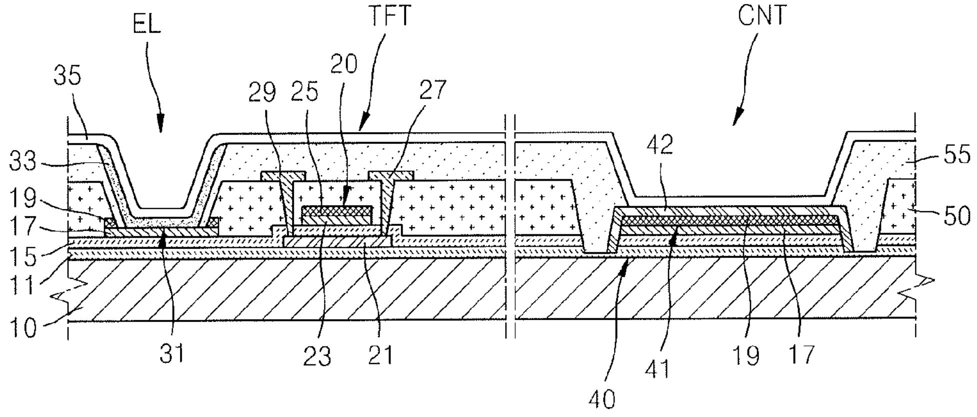
FIG. 1 is a cross-sectional view of an organic light-emitting display apparatus according to an embodiment.

Expressions such as "at least one of," when preceding a list of elements, modify the entire list of elements and do not modify the individual elements of the list.

Hereinafter, embodiments will be described in detail by explaining exemplary embodiments with reference to the attached drawings. Like reference numerals in the drawings refer to like elements.

In the drawings illustrating embodiments, the thickness or size of each layer illustrated in the drawings are exaggerated for convenience of explanation and clarity. Also, in the present specification, when a constituent element such as a layer, a film, a region, a plate, etc. is located "on" another constituent element, the constituent element should be construed to be located not only "directly on" the other constituent element, but also above the other constituent element through at least one of other constituent elements.

FIG. 1 is a cross-sectional view of a bottom-emission type organic light-emitting display apparatus according to an embodiment.

Referring to FIG. 1, the organic light-emitting display apparatus according to the present embodiment includes a thin film transistor TFT, an organic light-emitting device EL, and an opposite electrode contact portion CNT in which an opposite electrode 35 of the organic light-emitting device EL is connected to a power interconnection line 40.

The thin film transistor TFT includes an active layer 21, a gate electrode 20, and source and drain electrodes 27 and 29. The gate electrode 20 includes a lower gate electrode 23 and an upper gate electrode 25. The lower gate electrode 23 is formed of a transparent conductive material, and the upper gate electrode 25 is formed of a metallic material. The gate electrode 20 is insulated from the active layer 21 by a gate insulating layer 15 interposed therebetween. Also, on both edges of the active layer 21, source and drain regions, into which a high-concentration impurity is injected, are disposed. The source and drain electrodes 27 and 29 are connected to the source and drain regions.

The organic light-emitting device EL includes a pixel electrode 31 connected to one of the source and drain electrodes 27 and 29 of the thin film transistor TFT, the opposite electrode 35 functioning as a cathode, and an intermediate layer 33 interposed between the pixel electrode 31 and the opposite electrode 35. In FIG. 1, a reference numeral 50 denotes an interlayer insulating layer (hereinafter referred to as a first insulating layer), and a reference numeral 55 denotes a pixel-defining layer (hereinafter referred to as a second insulating layer).

The opposite electrode contact portion CNT includes the power interconnection line 40 contacting the opposite electrode 35. The power interconnection line 40 includes a first interconnection layer 41 and a second interconnection layer 42. The first interconnection layer 41 and the gate electrode 20 are formed of a same material on a same plane. The second interconnection layer 42 and the source and drain electrodes 27 and 29 are formed out of a same material layer. In this regard, an insulating layer is not formed between the first and second interconnection layers 41 and 42. The first interconnection layer 41 and the second interconnection layer 42 directly contact each other and are connected to each other, and an insulating layer is not interposed therebetween, either at a center or at an end of the first interconnection layer 41 and the second interconnection layer 42. Accordingly, a step, which could be formed if an insulating layer were present in the power interconnection line 40, is not formed.

Also, the first insulating layer 50 is disposed outside the power interconnection line 40, with an interval between the first insulating layer 50 and the power interconnection line 40. The second insulating layer 55 is interposed between the second interconnection layer 42 and the opposite electrode 35, filling the interval between the second interconnection layer 42 and the opposite electrode 35. In this regard, the second insulating layer 55 further fills opening portions of the gate insulating layer 15 and the buffer layer 11 on the substrate 10. In a typical case, the second insulating layer 55 is interposed only between the power interconnection line 40 and the opposite electrode 35. However, according to the present embodiment, the second insulating layer 55 fills the interval between the first insulating layer 50 and the power interconnection line 40, further filling opening portions of the gate insulating layer 15 and the buffer layer 11. The opening portions of the gate insulating layer 15 and the buffer layer 11 may be adjacent to the opposite electrode contact portion. Accordingly, a strong coupling may be obtained due to the increased contact area. A step that could cause a film-separation is not formed, and the coupling may be strongly formed. Thus, the opposite electrode contact portion CNT may have a stable power connection state.

Hereinafter, a method of manufacturing an organic light-emitting display apparatus having a structure as described above is described below with reference to associated drawings.

FIGS. 2A to 2F are cross-sectional views illustrating a method of manufacturing the organic light-emitting display apparatus of FIG. 1, according to an embodiment.

Figure 2A:
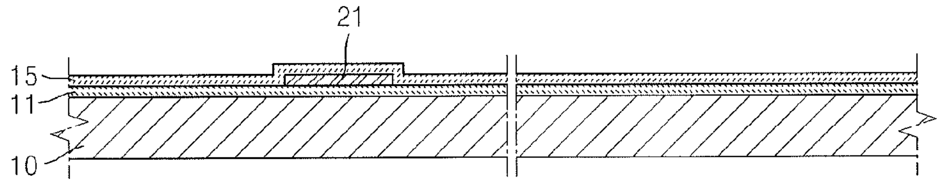
FIGS. 2A to 2F are cross-sectional views illustrating a method of manufacturing the organic light-emitting display apparatus of FIG. 1, according to an embodiment.

First, referring to FIG. 2A, a buffer layer 11 for planarizing the substrate 10 and preventing permeation of impurity elements is formed on the substrate 10.

The substrate 10 may be formed of a transparent glass material that mainly includes $SiO_2$. However, in other implementations, various other suitable substrates formed of, for example, a plastic material or a metallic material, may also be used as the substrate 10.

The active layer 21 of the thin film transistor TFT is formed on the buffer layer 11. The active layer 21 may be formed of a polycrystalline silicon material and may be formed by patterning using a mask process. Thereafter, the gate insulating layer 15 is formed on the patterned active layer 21. The gate insulating layer 15 may be formed by depositing an inorganic insulating film, such as $SiN_x$ or $SiO_x$, by using PECVD, APCVD, or LPCVD.

Figure 2B:
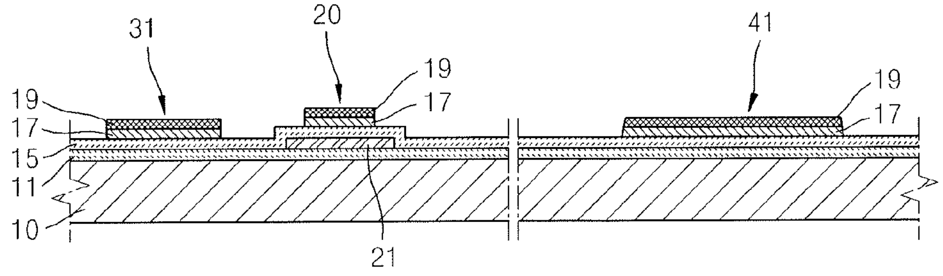

Subsequently, as illustrated in FIG. 2B, a first conductive layer 17 and a second conductive layer 19 are sequentially deposited on the gate insulating layer 15, and then, the pixel electrode 31 of the organic light-emitting device EL, the gate electrode 20 of the thin film transistor TFT, and the first interconnection layer 41 that constitutes the power interconnection line 40 of the opposite electrode contact portion CNT are formed by patterning The first conductive layer 17 may include at least one material selected from ITO, IZO, ZnO, and $In_2O_3$, which are transparent materials. The second conductive layer 19 may include at least one material selected from Ag, Mg, Al, Pt, Pd, Au, Ni, Nd, Ir, Cr, Li, Ca, Mo, Ti, W, MoW, and Al/Cu.

The first conductive layer 17 and the second conductive layer 19 are sequentially deposited on an overall surface of the substrate 10, and then patterned by using a mask process to form the gate electrode 20, the pixel electrode 31, and the first interconnection layer 41.

The gate electrode 20 corresponds to the center of the active layer 21. In this state, while using the gate electrode 20 as a mask, n-type or p-type impurities are doped on the active layer 21, so that a channel portion is formed in a portion of the active layer 21 shielded by the gate electrode 20 and source and drain portions are formed in a portion of the active layer exposed by the gate electrode 20.

Figure 2C:
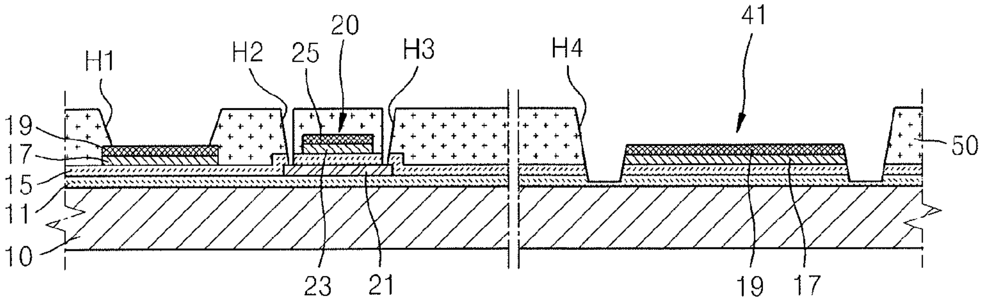

Referring to FIG. 2C, the first insulating layer 50 is deposited on the overall surface of the substrate 10, and openings H1, H2, H3, and H4 are formed therein by using a mask process.

The first insulating layer 50 may be formed by spin coating at least one organic insulating material selected from polyimide, polyamide, an acryl resin, benzocyclobutene, and a phenol resin, and may be formed in a thickness greater than that of the gate insulating layer 15 to function as an interlayer insulating layer between the gate electrode 20 and the source and drain electrodes 27 and 29 of the thin film transistor TFT. Also, the first insulating layer 50 may be formed of, in addition to those organic insulating materials, the inorganic insulating materials which have been described with reference to the gate insulating layer 15. In other implementations, an organic insulating material and an inorganic insulating material may be used to form the first insulating layer 50.

The first insulating layer 50 is patterned to form openings H1, H2, H3, and H4, exposing the source and drain portions of the active layer 21 and the first interconnection layer 41. In this regard, surrounding the first interconnection layer 41, even portions of the gate insulating layer 15 and the buffer layer 11 are etched, thereby forming a gap between the first interconnection layer 41 and the first insulating layer 50.

Figure 2D:
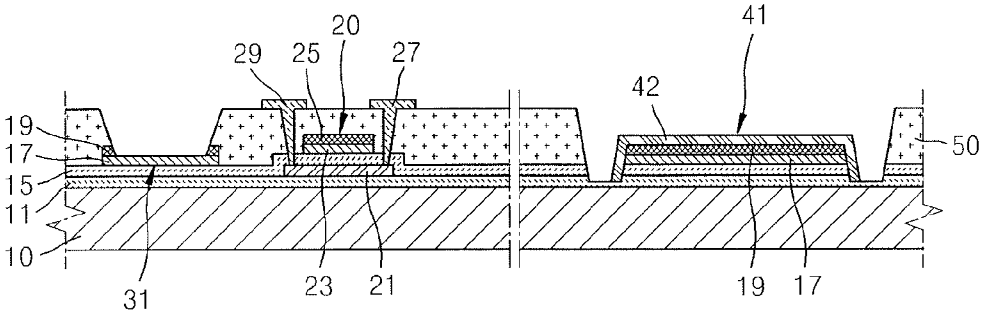

Referring to FIG. 2D, a third conductive layer is deposited on the resultant structure and then patterned to form the source and drain electrodes 27 and 29 of the thin film transistor TFT and the second interconnection layer 42 of the power interconnection line 40. The third conductive layer may be formed of a material selected from the conductive materials described with reference to the first or second conductive layers 17 and 19, or may be formed of an Mo/Al/Mo material. The third conductive layer is patterned to form the source and drain electrodes 27 and 29 and the second interconnection layer 42. The second interconnection layer 42 is formed to surround an end of the first interconnection layer 41. The pixel electrode 31 is etched in such a way that the first conductive layer 17 is exposed. Also, although not illustrated in the drawings, one of the source and drain electrodes 27 and 29 may be connected to the pixel electrode 31.

Figure 2E:
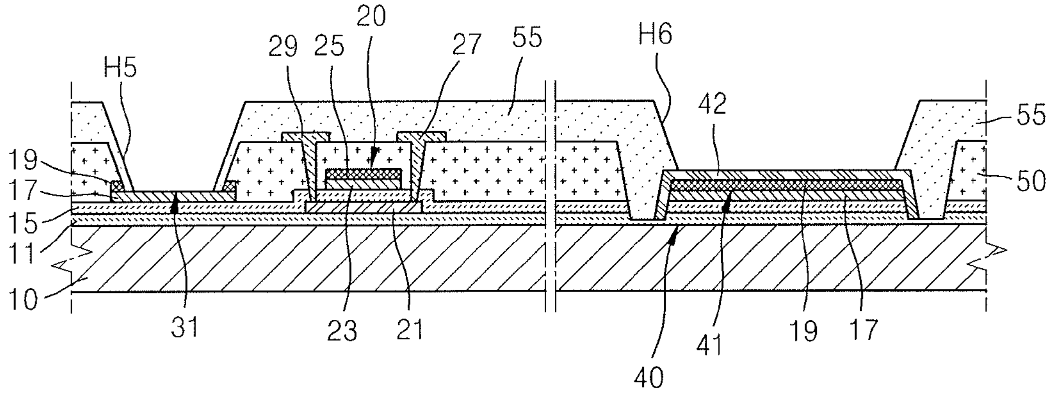

Referring to FIG. 2E, the second insulating layer 55 is formed on the substrate 10. The second insulating layer 55 may be formed by, for example, spin coating at least one organic insulating material selected from polyimide, polyamide, an acryl resin, benzocyclobutene, and a phenol resin.

The second insulating layer 55 is patterned to form openings H5 and H6 respectively exposing a central portion of the pixel electrode 31 and a portion of the second interconnection layer 42.

Figure 2F:
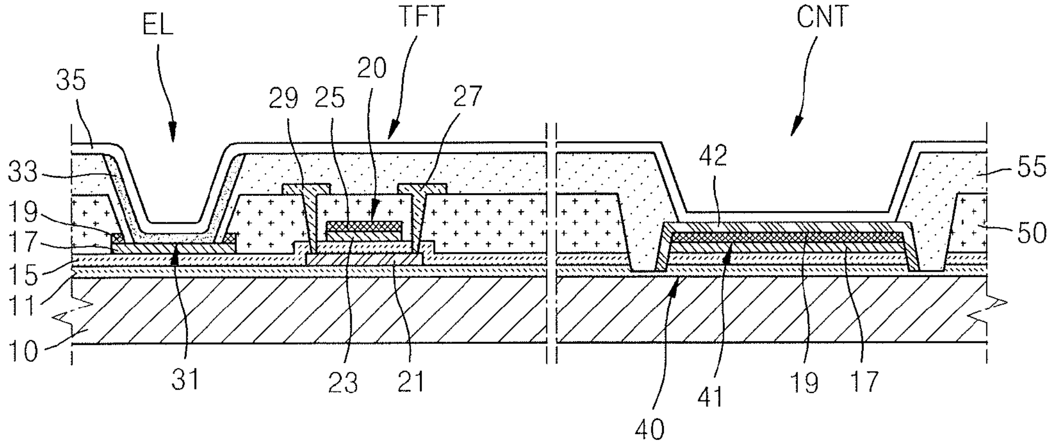

Thereafter, as illustrated in FIG. 2F, the intermediate layer 33 including an organic emissive layer is formed inside the opening H5 exposing the pixel electrode 31, and then, the opposite electrode 35 is formed.

The intermediate layer 33 may include an organic emissive layer (EML), and at least one layer selected from a hole transport layer (HTL), a hole injection layer (HIL), an electron transport layer (ETL), and an electron injection layer (EIL), each of which may have a single- or multi-layered structure.

The opposite electrode 35 is deposited on the overall surface of the substrate 10, and in this case, the opposite electrode 35 contacts the second interconnection layer 42 of the power interconnection line 40 through the opening H6.

By performing these processes described above, a step protruding from the power interconnection line 40 of the opposite electrode contact portion CNT may not be formed. Accordingly, film-separation, that is, separation of the second insulating layer 55 or the opposite electrode 35 deposited on the power interconnection line 40 due to the step may be prevented. Also, due to the absence of the step, a stable contact surface between the power interconnection line 40 and the opposite electrode 35 may be increased, thereby reducing resistance, leading to a decrease in a voltage drop.

Figure 3:
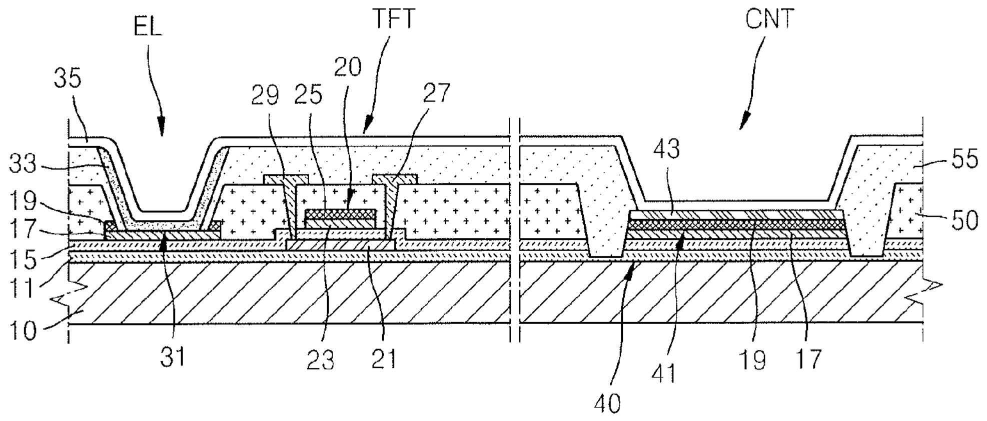
FIG. 3 is a cross-sectional view of an organic light-emitting display apparatus according to another embodiment.

FIG. 3 is a cross-sectional view of a bottom-emission type organic light-emitting display apparatus according to another embodiment.

Referring to FIG. 3, the organic light-emitting display apparatus according to the present embodiment includes a thin film transistor TFT, an organic light-emitting device EL, and an opposite electrode contact portion CNT in which an opposite electrode 35 of the organic light-emitting device EL is connected to the first and second interconnection layers 41 and 42.

The thin film transistor TFT includes an active layer 21, a gate electrode 20, and source and drain electrodes 27 and 29. The gate electrode 20 includes a lower gate electrode 23 and an upper gate electrode 25. The lower gate electrode 23 is formed of a transparent conductive material, and the upper gate electrode 25 is formed of a metallic material. The gate electrode 20 is insulated from the active layer 21 by a gate insulating layer 15 interposed therebetween. Also, on both edges of the active layer 21, source and drain regions, into which a high-concentration impurity is injected, are formed. The source and drain electrodes 27 and 29 are connected to the source and drain regions.

The organic light-emitting device EL includes a pixel electrode 31 connected to one of the source and drain electrodes 27 and 29 of the thin film transistor TFT, the opposite electrode 35 functioning as a cathode, and an intermediate layer 33 interposed between the pixel electrode 31 and the opposite electrode 35. In FIG. 3, a reference numeral 50 denotes an interlayer insulating layer (hereinafter referred to as a first insulating layer), and a reference numeral 55 denotes a pixel-defining layer (hereinafter referred to as a second insulating layer).

The opposite electrode contact portion CNT includes a power interconnection line 40 contacting the opposite electrode 35. The power interconnection line 40 includes a first interconnection layer 41 and a second interconnection layer 43. The first interconnection layer 41 and the gate electrode 20 are formed of the same material on the same plane. The second interconnection layer 43 and the source and drain electrodes 27 and 29 are formed out of the same material layer. In this regard, an insulating layer is not formed between the first and second interconnection layers 41 and 43. The first interconnection layer 41 and the second interconnection layer 43 directly contact each other and are connected to each other, and an insulating layer is not interposed therebetween, either at a center or at an end of the first interconnection layer 41 and the second interconnection layer 43. Accordingly, a step, which could be formed if an insulating layer were present in the power interconnection line 40, is not formed.

Also, the first insulating layer 50 is disposed outside the power interconnection line 40, with an interval between the first insulating layer 50 and the power interconnection line 40. The second insulating layer 55 is interposed between the second interconnection layer 43 and the opposite electrode 35, filling the interval between the second interconnection layer 42 and the opposite electrode 35. In this regard, the second insulating layer 55 fills opening portions of the gate insulating layer 15 and the buffer layer 11 on the substrate 10. Typically, the second insulating layer 55 is interposed only between the power interconnection line 40 and the opposite electrode 35. However, according to the present embodiment, the second insulating layer 55 fills the interval between the first insulating layer 50 and the power interconnection line 40, further filling opening portions of the gate insulating layer 15 and the buffer layer 11. The opening portions of the gate insulating layer 15 and the buffer layer 11 may be adjacent to the opposite electrode contact portion. Accordingly, a strong coupling may be obtained due to the increased contact area. A step that could cause a film-separation is not formed, and the coupling may be strongly formed. Thus, the opposite electrode contact portion CNT may have a stable power connection state.

Hereinafter, a method of manufacturing an organic light-emitting display apparatus having a structure as described above is described below with reference to associated drawings.

FIGS. 4A to 4F are cross-sectional views illustrating a method of manufacturing the organic light-emitting display apparatus of FIG. 3, according to an embodiment.

Figure 4A:
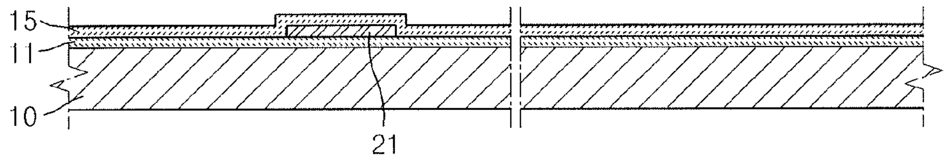
FIGS. 4A to 4F are cross-sectional views illustrating a method of manufacturing the organic light-emitting display apparatus of FIG. 3, according to an embodiment.

First, referring to FIG. 4A, a buffer layer 11 for planarizing the substrate 10 and preventing permeation of impurity elements is formed on the substrate 10.

The substrate 10 may be formed of a transparent glass material that mainly includes $SiO_2$. However, in other implementations, various other suitable substrates formed of, for example, a plastic material or a metallic material, may also be used as the substrate 10.

The active layer 21 of the thin film transistor TFT is formed on the buffer layer 11. The active layer 21 may be formed of a polycrystalline silicon material and may be patterned by using a mask process. Thereafter, the gate insulating layer 15 is formed on the patterned active layer 21. The gate insulating layer 15 may be formed by depositing an inorganic insulating film, such as $SiN_x$ or $SiO_x$, by using PECVD, APCVD, or LPCVD.

Figure 4B:
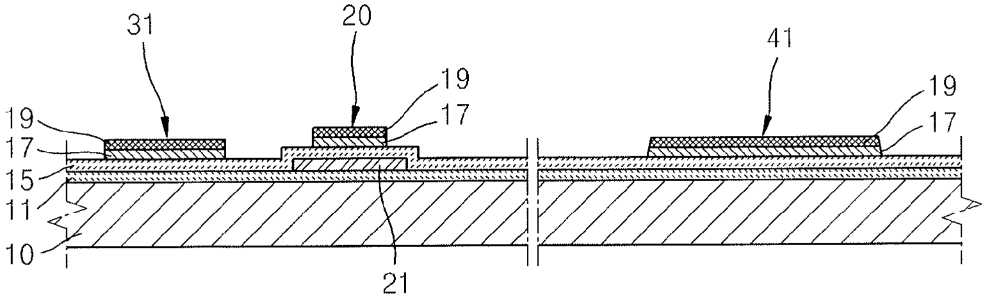

Subsequently, as illustrated in FIG. 4B, a first conductive layer 17 and a second conductive layer 19 are sequentially deposited on the gate insulating layer 15, and then, the pixel electrode 31 of the organic light-emitting device EL, the gate electrode 20 of the thin film transistor TFT, and the first interconnection layer 41 that constitutes the power interconnection line 40 of the opposite electrode contact portion CNT are formed by patterning.

The first conductive layer 17 may include at least one material selected from ITO, IZO, ZnO, and $In_2O_3$, which are transparent materials. The second conductive layer 19 may include at least one material selected from Ag, Mg, Al, Pt, Pd, Au, Ni, Nd, Ir, Cr, Li, Ca, Mo, Ti, W, MoW, and Al/Cu.

The first conductive layer 17 and the second conductive layer 19 are sequentially deposited on an overall surface of the substrate 10, and then patterned by using a mask process to form the gate electrode 20, the pixel electrode 31, and the first interconnection layer 41.

The gate electrode 20 corresponds to the center of the active layer 21. In this state, while using the gate electrode 20 as a mask, n-type or p-type impurities are doped on the active layer 21, so that a channel portion is formed in a portion of the active layer 21 shielded by the gate electrode 20 and source and drain portions are formed in a portion of the active layer exposed by the gate electrode 20.

Figure 4C:
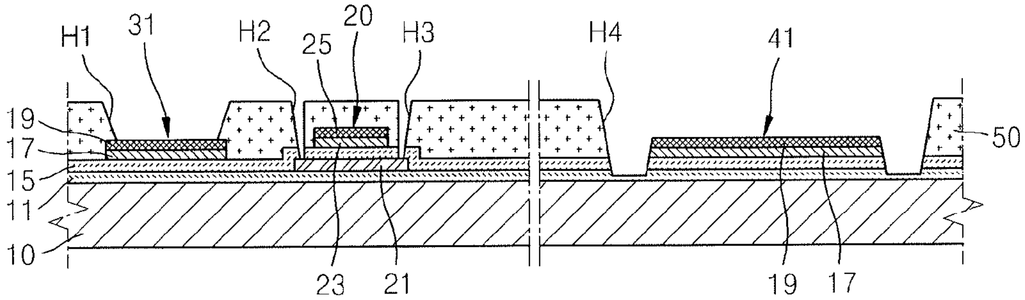

Referring to FIG. 4C, the first insulating layer 50 is deposited on the overall surface of the substrate 10, and openings H1, H2, H3, and H4 are formed therein by using a mask process.

The first insulating layer 50 may be formed by spin coating at least one organic insulating material selected from polyimide, polyamide, an acryl resin, benzocyclobutene, and a phenol resin, and may be formed in a thickness greater than that of the gate insulating layer 15 to function as an interlayer insulating layer between the gate electrode 20 and the source and drain electrodes 27 and 29 of the thin film transistor TFT. Also, the first insulating layer 50 may be formed of, in addition to those organic insulating materials, the inorganic insulating materials which have been described with reference to the gate insulating layer 15. In other implementations, an organic insulating material and an inorganic insulating material may be alternately used to form the first insulating layer 50.

The first insulating layer 50 is patterned to form openings H1, H2, H3, and H4, exposing the source and drain portions of the active layer 21 and the first interconnection layer 41. In this regard, surrounding the first interconnection layer 41, even portions of the gate insulating layer 15 and the buffer layer 11 are etched, thereby forming a gap between the first interconnection layer 41 and the first insulating layer 50.

Figure 4D:
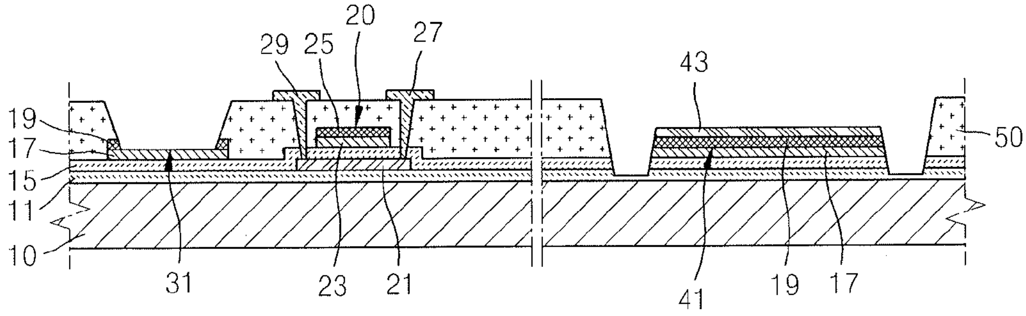

Referring to FIG. 4D, a third conductive layer is deposited on the resultant structure and then patterned to form the source and drain electrodes 27 and 29 of the thin film transistor TFT and a second interconnection layer 43 of the power interconnection line 40. The third conductive layer may be formed of a material selected from the conductive materials described with reference to the first or second conductive layers 17 and 19, or may be formed of an Mo/Al/Mo material. The third interconnection layer is patterned to form the source and drain electrodes 27 and 29 and the second interconnection layer 43. The second interconnection layer 43 may be formed in the same pattern as the first interconnection layer 41. In the previous embodiment, the first interconnection layer (42 of FIG. 1) surrounds the end of the first interconnection layer 41. However, in the present embodiment, the second interconnection layer 43 is formed in the same pattern as the first interconnection layer 41. The pixel electrode 31 is etched in such a way that the first conductive layer 17 is exposed. Also, although not illustrated in the drawings, one of the source and drain electrodes 27 and 29 is connected to the pixel electrode 31.

Figure 4E:
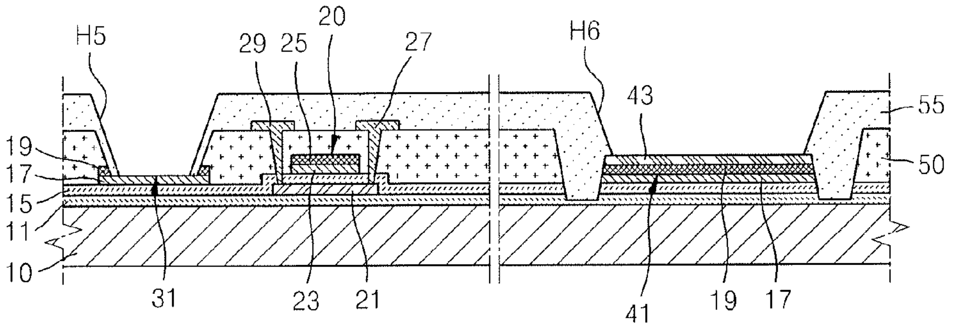

Referring to FIG. 4E, the second insulating layer 55 is formed on the substrate 10. The second insulating layer 55 may be formed by, for example, spin coating at least one organic insulating material selected from polyimide, polyamide, an acryl resin, benzocyclobutene, and a phenol resin.

The second insulating layer 55 is patterned to form openings H5 and H6 respectively exposing a central portion of the pixel electrode 31 and a portion of the second interconnection layer 43.

Figure 4F:
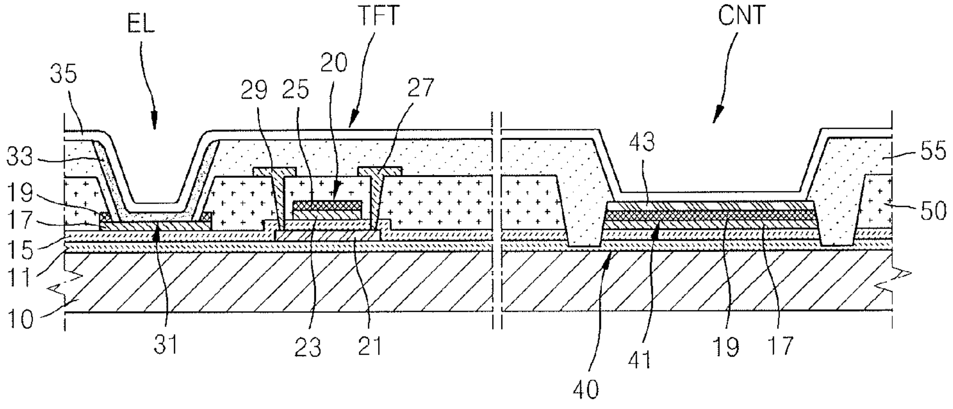

Thereafter, as illustrated in FIG. 4F, the intermediate layer 33 including an organic emissive layer is formed inside the opening H5 exposing the pixel electrode 31, and then, the opposite electrode 35 is formed.

The intermediate layer 33 may include an EML, and at least one layer selected from a HTL, a HIL, an ETL, and an EIL, each of which may have a single- or multi-layered structure.

The opposite electrode 35 is deposited on the overall surface of the substrate 10, and in this case, the opposite electrode 35 contacts the second interconnection layer 43 of the power interconnection line 40 through the opening H6.

Accordingly, according to the present embodiment, by performing these processes described above, a step protruding from the power interconnection line 40 of the opposite electrode contact portion CNT may not be formed. Accordingly, film-separation, that is, separation of the second insulating layer 55 or the opposite electrode 35 deposited on the power interconnection line 40 due to the step may be prevented. Also, due to the absence of the step, a stable contact surface between the power interconnection line 40 and the opposite electrode 35 may be obtained, thereby reducing resistance, leading to a decrease in a voltage drop.

By way of summation and review, to obtain an appropriate level of voltage in an emissive layer of an organic light-emitting device, the opposite electrode may retain an appropriate level of voltage by connection with a power interconnection line. In a general case, however, film-separation may frequently occur in a contact portion of the opposite electrode that is connected to the power interconnection line. Further, a power interconnection line connected to an opposite electrode may include a plurality of interconnection layers, and an insulating layer is formed between ends of the interconnection layers. In this structure, the end of the power interconnection line with the insulating layer formed between interconnection layers thereof protrudes more than a central portion of the interconnection line, thereby forming a step. Accordingly, an insulating layer covering the ends of the interconnection line and the opposite electrode, which is formed thereon contacting the power interconnection line, do not completely contact the power interconnection line due to the step and thus, a gap is formed therebetween, thus causing a film-separation to occur.

Once the film-separation occurs, power connection to the opposite electrode may become unstable, leading to the production of defective products.

Accordingly, an improved structure for suppressing film-separation in a contact portion of an opposite electrode is desired to embody a stable organic light-emitting display apparatus.

Embodiments provide an organic light-emitting display apparatus that is improved to suppress occurrence of film-separation in an opposite electrode contact portion and a method of manufacturing the organic light-emitting display apparatus.

According to organic light-emitting display apparatuses and methods of manufacturing the same according to the embodiments, film-separation, which could occur in an opposite electrode contact portion, may be prevented, and thus, a stable power connection to an opposite electrode may be obtained, and also, due to the increased area of a contact portion, resistance is reduced and a voltage drop may be prevented.

While embodiments have been particularly shown and described with reference to exemplary embodiments thereof, it will be understood by those of skill in the art that various changes in form and details may be made therein without departing from the spirit and scope thereof as defined by the following claims.

What is claimed is:

1. An organic light-emitting display apparatus, comprising:

a thin film transistor (TFT) including an active layer, a gate electrode, and source and drain electrodes; and an organic light-emitting device including a pixel electrode connected to the TFT, an intermediate layer having an emissive layer, and an opposite electrode;

an opposite electrode contact portion on the substrate connecting the opposite electrode to a power interconnection line, and the power interconnection line connected to the opposite electrode contact portion including a first interconnection layer and a second interconnection layer, the first and second interconnection layers being stacked without an insulating layer therebetween.

2. The organic light-emitting display apparatus of claim 1, wherein the first interconnection layer is on a same plane as the gate electrode, and the second interconnection layer is formed of a same material layer as the source and drain electrodes.

3. The organic light-emitting display apparatus of claim 1, further comprising:

a first insulating layer that is outside the power interconnection line of the opposite electrode contact portion, with an interval being between the first insulating layer and the power interconnection line, and a second insulating layer filling the interval between the first insulating layer and the power interconnection line.

4. The organic light-emitting display apparatus of claim 3, further comprising:

a gate insulating layer between the active layer and the gate electrode, and a buffer layer under the active layer, the gate insulating layer and the buffer layer including open portions adjacent to the opposite electrode contact portion, wherein the second insulating layer further fills the open portions of the gate insulating layer and the buffer layer.

5. The organic light-emitting display apparatus of claim 4, wherein the second insulating layer is present between e of the second interconnection layer and the opposite electrode.

6. The organic light-emitting display apparatus of claim 5, wherein:

the second interconnection layer surrounds an end of the first interconnection layer, and the second insulating layer is present between the end of the second interconnection layer and the first insulating layer.

7. The organic light-emitting display apparatus of claim 5, wherein:

the first interconnection layer and the second interconnection layer are formed in a same pattern, and the second insulating layer is present between the first insulating layer and ends of the first interconnection layer and the second interconnection layer.

8. A method of manufacturing an organic light-emitting display apparatus, the method comprising forming a first interconnection layer in an opposite electrode contact portion of a substrate;

forming a first insulating layer outside the first interconnection layer, with an interval therebetween;

forming a second interconnection layer on the first interconnection layer to form a power interconnection line including a plurality of interconnection layers;

forming a second insulating layer on an end of the second interconnection layer and between the power interconnection line and the first insulating layer; and forming an opposite electrode on the second insulating layer such that the opposite electrode contacts the power interconnection line.

9. The method of claim 8, further comprising forming an active layer, a gate electrode, and source and drain electrodes of a thin film transistor (TFT), wherein:

the first interconnection layer and the gate electrode are formed of a same material on a same plane, and the second interconnection layer and the source and drain electrodes are formed of a same material layer.

10. The method of claim 9, further comprising:

sequentially depositing a buffer layer and a gate insulating layer on the substrate such that the gate insulating layer and the buffer layer include open portions adjacent to the opposite electrode contact portion, and forming the second insulating layer filling the open portions of the gate insulating layer and the buffer layer.

11. The method of claim 8, wherein:

the second interconnection layer surrounds an end of the first interconnection layer, and the second insulating layer is interposed between the end of the second interconnection layer and the first insulating layer.

12. The method of claim 8, wherein:

the second interconnection layer is formed on the first interconnection layer in a same pattern as the first interconnection layer, and the second insulating layer is interposed between ends of the first insulating layer and the first interconnection layer and the second interconnection layer.

* * * * *